United States Patent [19]
Liew

[11] Patent Number: 5,805,638
[45] Date of Patent: Sep. 8, 1998

[54] SYSTEMS AND METHODS OF DIGITAL WIRELESS COMMUNICATION USING EQUALIZATION

[75] Inventor: William J. Liew, Matawan, N.J.

[73] Assignee: Lucent Technologies Inc., Murray Hill, N.J.

[21] Appl. No.: 566,771

[22] Filed: Dec. 4, 1995

[51] Int. Cl.⁶ .............................. H03H 7/30; H04L 27/06
[52] U.S. Cl. ............................................ 375/231; 375/341
[58] Field of Search .................................... 375/231, 232, 375/341, 340, 262, 316; 371/43

[56] References Cited

U.S. PATENT DOCUMENTS

| 5,185,764 | 2/1993 | Baier | 375/231 |
| 5,199,047 | 3/1993 | Koch | 375/231 |
| 5,274,670 | 12/1993 | Serizawa et al. | 375/231 |
| 5,432,821 | 7/1995 | Polydoros et al. | 375/340 |
| 5,471,501 | 11/1995 | Parr et al. | 375/354 |
| 5,519,727 | 5/1996 | Okanoue et al. | 375/231 |
| 5,533,063 | 7/1996 | Mitra et al. | 375/231 |
| 5,557,645 | 9/1996 | Dent | 375/340 |
| 5,579,344 | 11/1996 | Namekata | 375/341 |
| 5,581,580 | 12/1996 | Lindbom et al. | 375/340 |

Primary Examiner—Tesfaldet Bocure

[57] ABSTRACT

A wireless digital communication system, such as a cellular mobile communication system, overcomes channel dispersion and multipath fade with an equalizer using matrix division channel estimation followed by maximum likelihood sequence estimation for each time slot. The matrix division channel estimation involves storing transforms of the training symbols and producing a linear combination of received training symbols and the stored transforms.

22 Claims, 5 Drawing Sheets

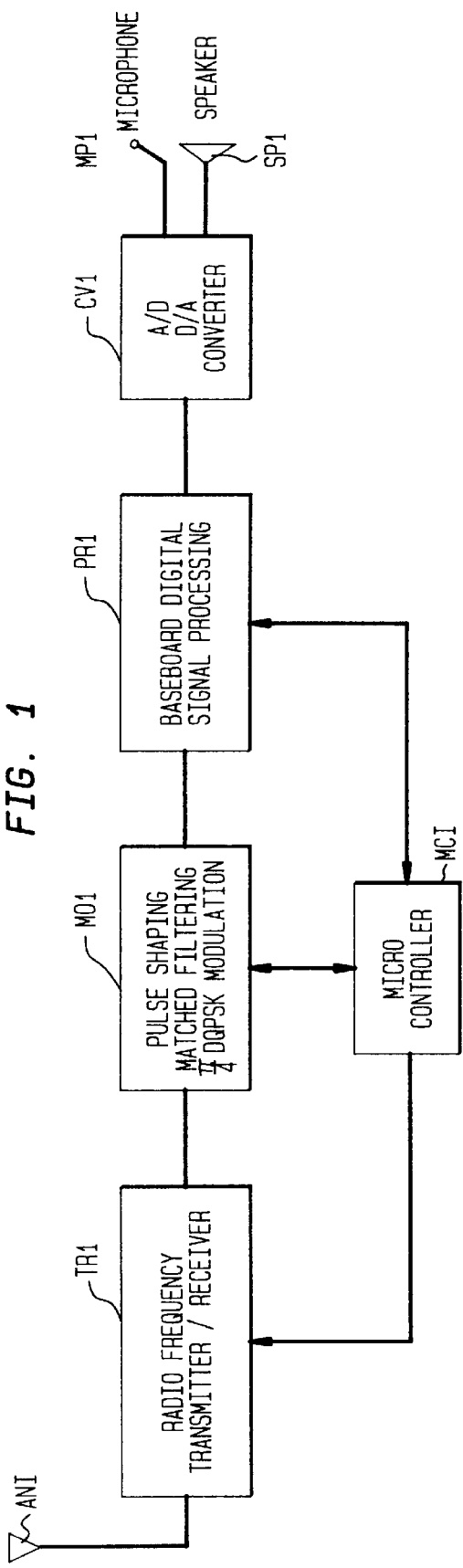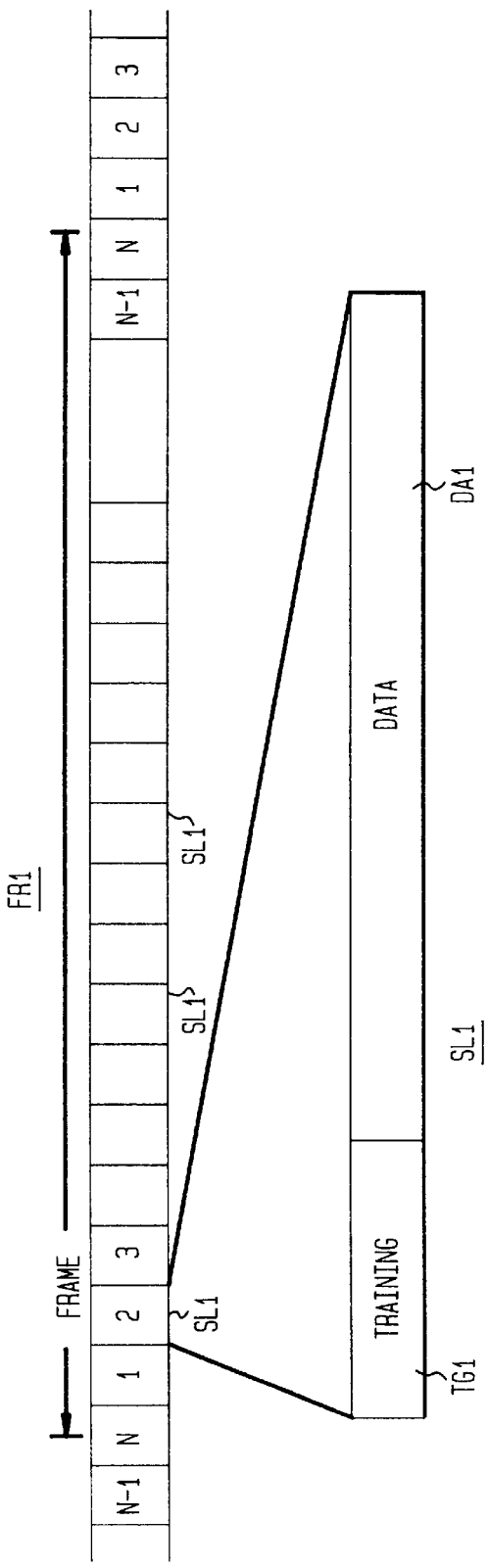

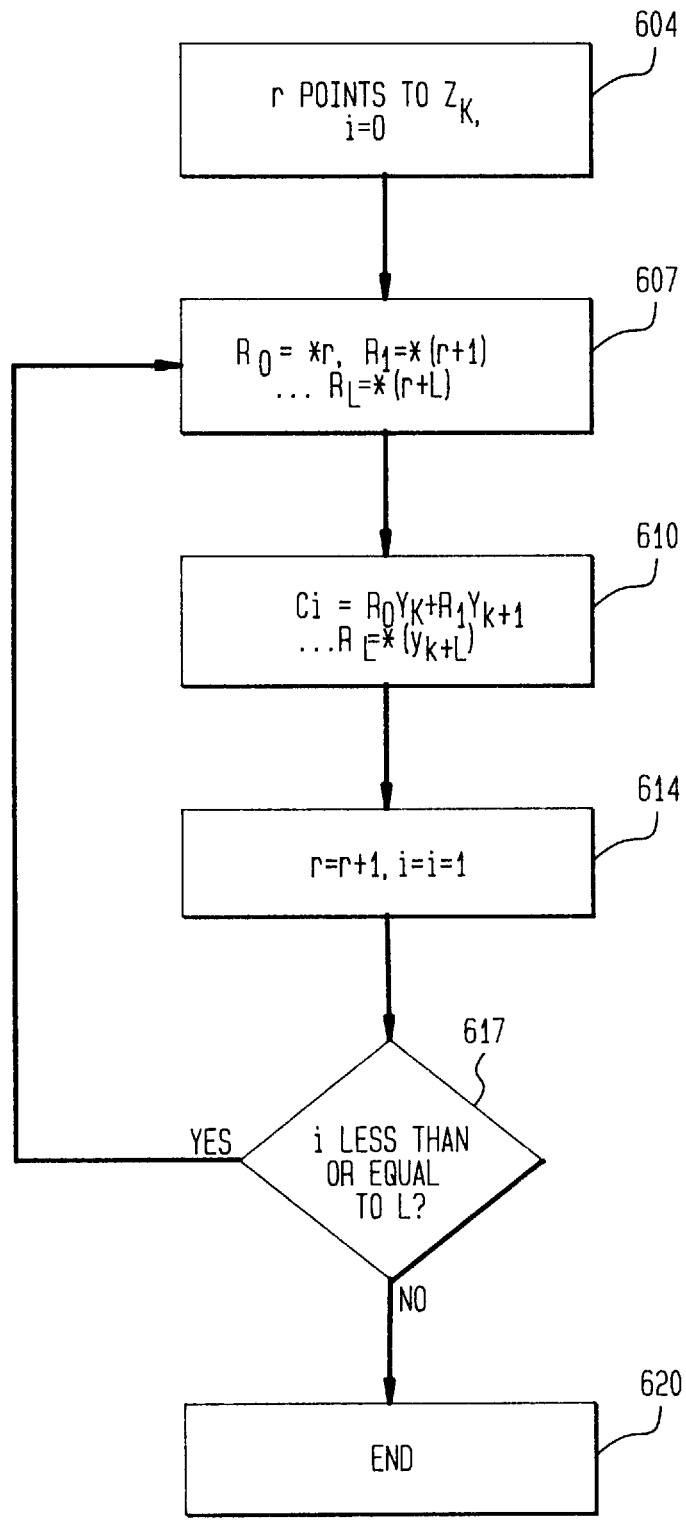

SYSTEMS AND METHODS OF DIGITAL WIRELESS COMMUNICATION USING EQUALIZATION

FIELD OF THE INVENTION

This invention relates to digital wireless communication using equalization for overcoming the effects of multi-path fading and interference, and in particular to mobile and cellular systems which encounter hostile environments as may occur in mountainous and tree covered territories.

BACKGROUND OF THE INVENTION

Mobile digital communication systems, such as cellular telephone systems, often suffer from multi-path fading of the signal when a vehicle carrying the system passes through mountainous territory or operates in the vicinity of towering trees. The speed of the vehicle also affects the communication.

Transmission of digital wireless communication signals occurs in frames composed of time slots each of which carries a predetermined number of symbols. Within each time slot a number of multi-path fades can occur. Moreover reflection of radio frequency rays by mountains and trees can shift the signal between symbol positions. This tends to degrade performance.

Attempts to overcome such degraded performance have involved the use of linear equalizers, decision feedback, and equalizers using maximum likelihood sequence estimation (MLSE). In general the performance of such systems has not been as desired and substantial numbers of training symbols must be used for each slot.

SUMMARY OF THE INVENTION

According to an embodiment of the invention, a system has a base station and a mobile cellular phone. For received signals, a signal processing arrangement detects and minimizes the effects of impairments suffered from hostile environments by means of an equalizer that combines channel estimation using matrix division with maximum likelihood sequence decoding on the basis of received data and training signals. The matrix division is referred to as matrix division channel estimation.

The various aspects of novelty which characterize the invention are pointed out in the claims. Objects and advantages of the invention will become evident from the following description when read in light of the accompanying drawings.

BRIEF DESCRIPTION OF THE DRAWINGS

FIG. 1 is a block diagram of a digital cellular telephone embodying aspects of the invention.

FIG. 1A shows frames and slots being transmitted to the digital cellular telephone in FIG. 1.

FIG. 6 shows the operation of a channel estimating step in FIG. 3 and structure of FIG. 4.

DETAILED DESCRIPTION OF PREFERRED EMBODIMENTS

Figure 2:
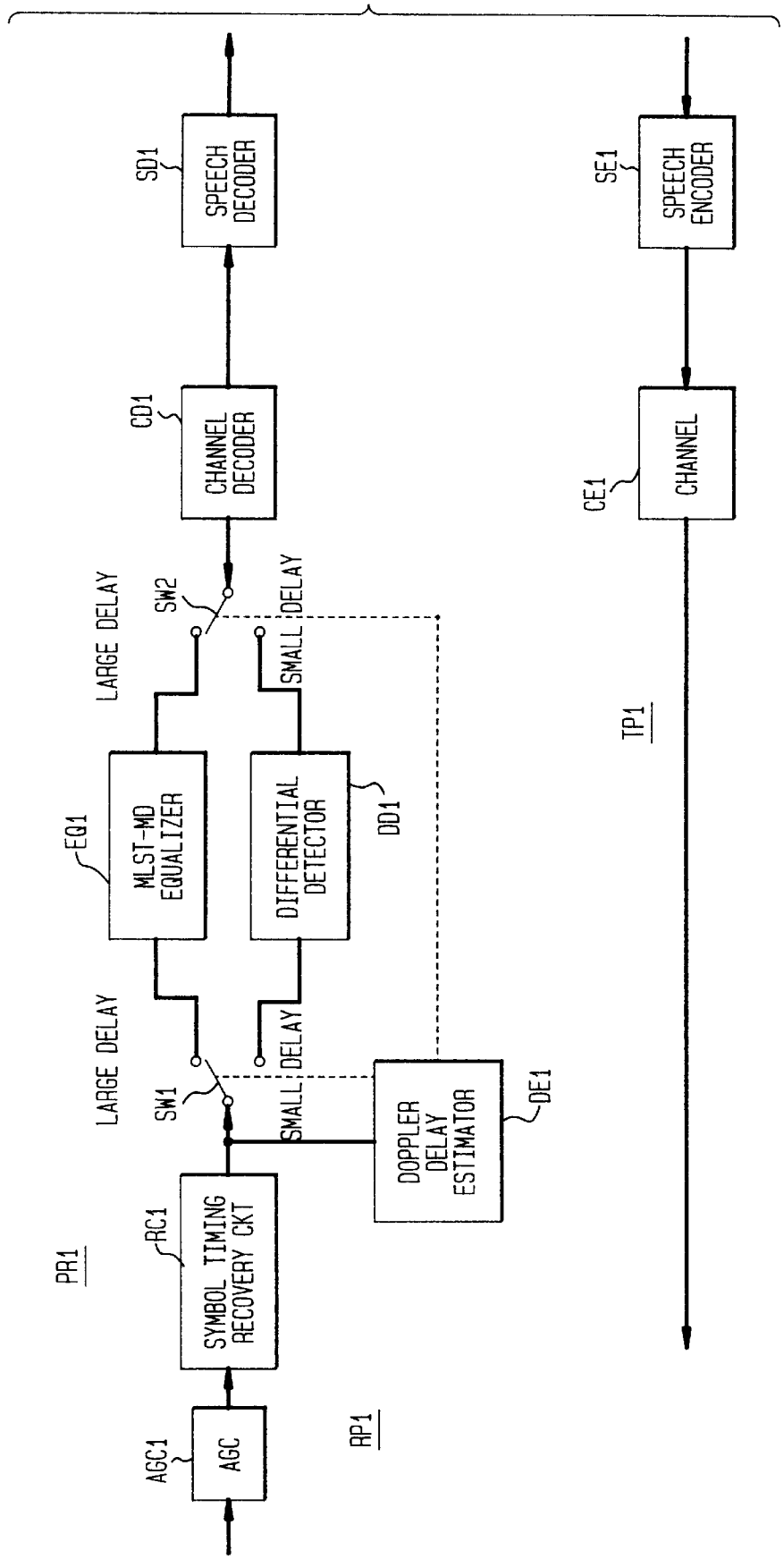
FIG. 2 is a block diagram of a baseband digital signal processor of the system of FIG. 1.

FIG. 1 is a block diagram illustrating details of a time division multiple access (TDMA) mobile cellular telephone which communicates with a time division multiple access (TDMA) base station which in turn communicates through a telephone utility system to another telephone. The other telephone may be another time division multiple access telephone communicating with another or the same station. As the mobile cellular phone CP1 moves, for example in an automobile from the transmission zone of one base station to the transmission zone of another base station, the communication between phone and base station is handed from one base station to the other.

The cellular phone CP1 and base stations transmit time-division digital data in sequential time frames divided into time slots. Each slot contains sequentially organized data symbols. As the signals propagate to the receiving phone or station, which may be moving at high speed, the space over which the signals propagate, particularly if it contains hostile environments such as trees and mountains, impairs the signals. To determine the traits of the impairment, the slots also contain training symbols. FIG. 1A illustrates an example of the organization of frames FR1, slots SL1, and sequences of training symbols TG1 and data symbols DA1 within a slot. Training symbols may also occur after each slot SL1 or in any part of the slot SL1. Each receiving phone or station also stores the training symbols to permit analysis of the impairment to the received training symbols and subsequent minimization of the effects of impairment. Each phone or station also transmits the training symbols in its transmission mode.

In FIG. 1, a radio frequency transmitter/receiver or transceiver TR1 of conventional type connects to a receiving and transmitting antenna AN1 tuned to the successive base stations. In its receive mode, the transceiver TR1 receives signals from the antenna AN1 and applies these to a pulse shaping matched filtering $\pi/4$ differential-quatenary-phase-shift-keying (DQPSK) modulator/demodulator MO1 of conventional construction. In the receive mode, the modulator/-demodulator MO1 demodulates the signals from the transceiver TR1, and in the transmit mode, modulates the signals from a baseband digital signal processor PR1 described in more detail in FIG. 2. According to an embodiment of the invention, the structure and operation of FIG. 1 is also used in the base stations communicating with the phone CP1. However, the base station may omit the microphone and speaker and may duplicate many of the other elements to service a number of phones.

In the receive mode, an analog-to-digital (A-D) and digital-to-analog (D-A) converter CV1 converts digital signals to analog form and applies them to a speaker SP1. In the transmit mode, the converter CV1 converts analog signals from a microphone MC1 to digital form and applies them to the processor PR1. A conventional microcontroller MC1 receives data from the modulator/demodulator MO1 and digital signal processor PR1 and transmits controlling data to the transceiver TR1, the modulator/demodulator MO1, and the baseband digital signal processor PR1. For example, it transmits channel hand-off commands that switch transmission and reception from one fixed base station to another at appropriate points.

The general construction and operation of the antenna AN1, the transceiver TN1, the modulator/demodulator MO1, processors PR1, the converters CV1, the microphone MP1, the speaker SP1, and the controller MC1 appear in the book *Microwave Mobile Communications* by W. Jakes (1974) published by John Wiley & Sons, New York and in the book *Mobile Communications Engineering* by W. Y. C. Lee (1982), published by McGraw-Hill Company, New York, N.Y. They are also described in *Digital Communica-*

*tions* by Jay G. Proakis (1989) second edition, published by McGraw-Hill Company, New York, N.Y.

FIG. 2 illustrates details of the baseband digital signal processor PR1 which includes a receive path RP1 and a transmit path TP1. In the receive path RP1, an automatic gain control AGC1 varies the gain of the system inversely with the magnitude of the signal. A symbol timing recovery circuit RC1 recovers the timing of the digital signals. The latter circuit is also described in the aforementioned books by Jakes, Lee, and Proakis. A Doppler delay estimator DE1 responds to the output of the circuit RC1 and uses a Doppler arrangement to estimate the delays which might be caused in the signals.

If the estimator DE1 estimates the delay as a small delay, such as may occur in clear surroundings and when a vehicle carrying the phone CP1 is stationary during wireless propagation, it sets two single-pole double-throw switches SW1 and SW2 into the lower positions of FIG. 2. This forms a path from the circuit RC1, through a differential detector DD1, to a channel decoder CD1. The switches SW1 and SW2 are preferably semiconductor switches or software switches.

If the estimator DE1 estimates that the delay is a large delay, such as may be caused by mountains or trees during wireless propagation, the estimator DE1 throws the switches SW1 and SW2 into their upper positions as shown in FIG. 2. This forms a signal path from the circuit RC1, through a maximum likelihood sequence estimation matrix division (MLSE-MD) equalizer EQ1, to the channel decoder CD1. Operation of the circuit RC1, differential detector DD1, Doppler delay estimator, and channel decoder CD1 are each described in the aforementioned texts by Jakes, Lee, and Proakis.

A speech decoder SD1 passes the output of the processor PR1 to the A/D and D/A converter CV1 of FIG. 1. The transmit path TP1 in the processor PR1 passes from the converter CV1 to a speech encoder SE1 and from there to a channel encoder CE1. The output of the channel encoder CE1 passes to the modulator/demodulator MO1. The encoder SE1 and encoder CE1 are of the type described in the texts of Jakes, Lee, and Proakis.

Figure 3:
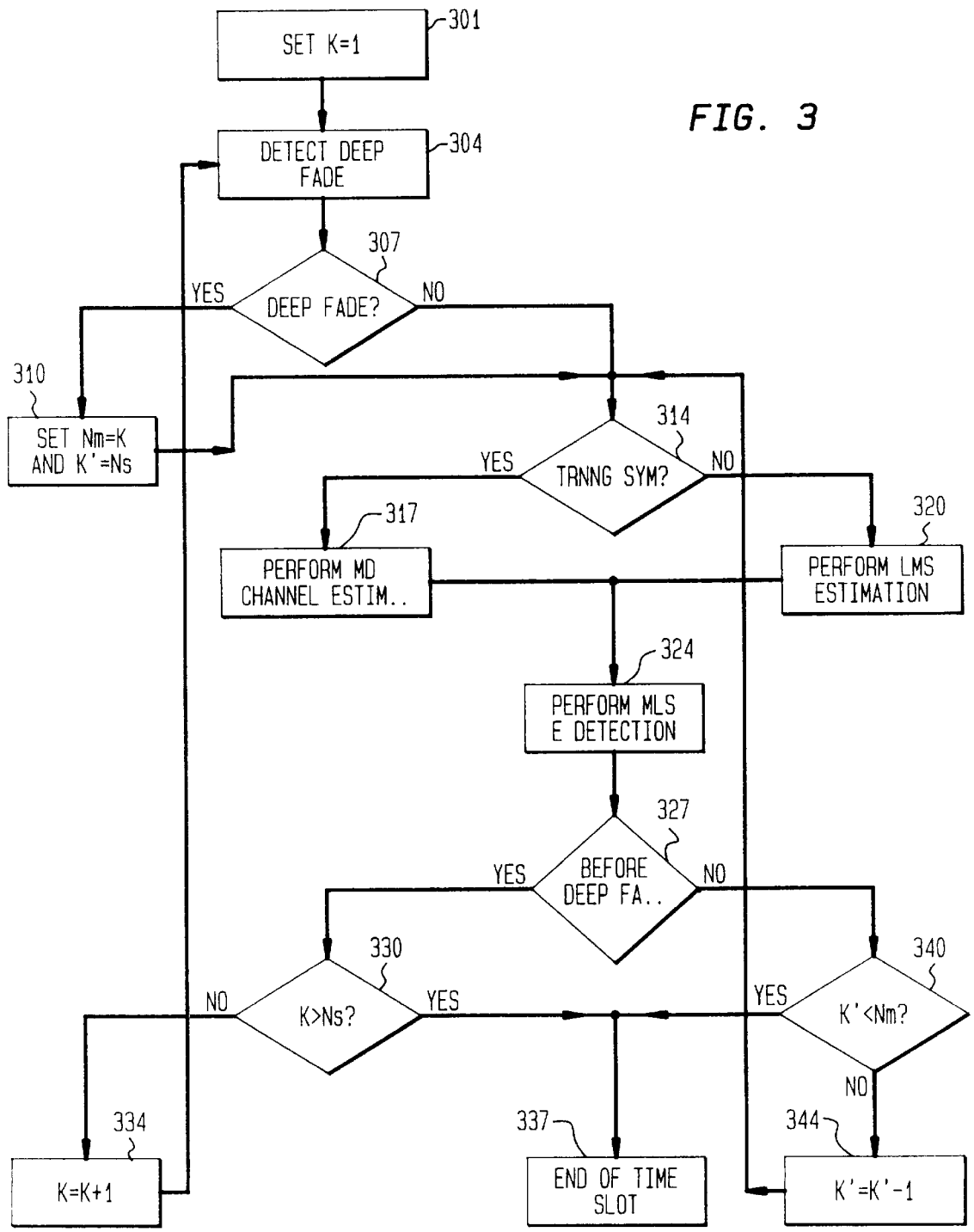
FIG. 3 is a flow chart of an equalizer illustrated in FIG. 2.
Figure 4:
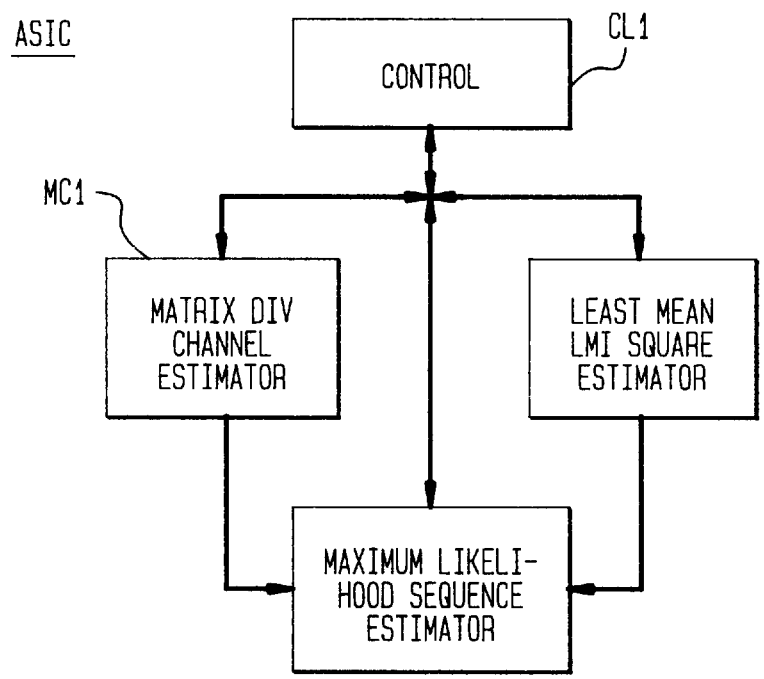
FIG. 4 is a block diagram of another embodiment of the equalizer illustrated in FIG. 2.
Figure 5:
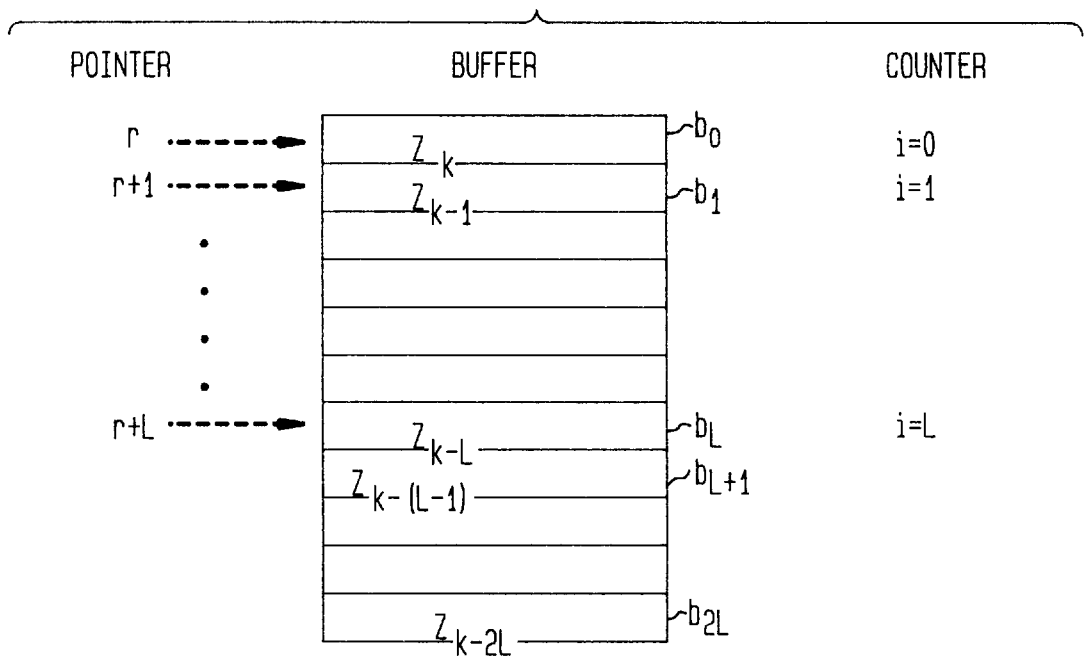
FIG. 5 shows detail of the equalizer of FIGS. 2 and 3.

The equalizer EQ1 in the processor PR1 includes or takes the form of a digital signal processor (DSP) that performs the steps shown in the flow chart of FIG. 3. The DSP may include or be in the form of a DSP chip. According to another embodiment, the equalizer is in the form of an application specific integrated circuit (ASIC) as shown in FIG. 4. The equalizer EQ1 determines the impairment the hostile environment, such as towering trees, mountains, overpasses and speed, impart to signals arriving at the mobile phone CP1. FIG. 5 illustrates details of structure within the DSP and the ASIC.

In step 301 of the flow chart of FIG. 3 the equalizer EQ1 or DSP sets a value K=1. In step 304 the DSP performs deep fade detection, for example, to determine whether incoming signal has faded within any slot, substantially as a result of multi-path arrival of radio frequency waves and interference from mountains, overpasses, speed, or other sources. The detection of such fades is described in the aforementioned texts by Jakes, Lee, and Proakis. In step 307 the DSP asks whether a deep fade has occurred. If yes, the DSP sets a value $N_m$=K and a value K' equal to N in step 310 where $N_s$ is the number of symbols per time slot. The DSP then, in step 314, inquires whether the current symbols are training symbols in the slot SL1. If the answer to step 307 is no, the DSP goes directly to step 314. There the DSP looks for training symbols in the time slot.

If the DSP in step 314 determines that the current symbols are training symbols in the slot SL1, the DSP goes to step 317 and performs matrix division channel estimation for each training symbol in the slot to estimate the channel. It then applies the channel estimation obtained from training symbols to channel estimation for each data symbol in the slot and the data output goes to step 324. If the answer to step 314 is no, the DSP performs least means square (LMS) channel estimation, or recursive least square channel estimation, in step 320.

In step 324, the DSP performs maximum likelihood sequence estimation or decoding (MLSE). In step 327, the DSP determines whether there has been an immediately prior deep fade. If yes, the DSP, in step 330, asks whether K is greater than $N_s$. If the answer to step 330 is no, the DSP then sets K=K+1 in step 334 and returns to 304. If the answer in step 330 is yes, the equalizer EQ1 has reached the end of this slot in 337.

If the answer to step 327 is no, the DSP, in 340, asks if the value of K' is less than $N_m$. If yes, it proceeds to step 337. If no, the DSP, in step 344 sets the value K'=K'−1. The DSP then returns to step 314.

The MD channel estimation of Step 317 determines the impairment or delay of the data signal during transmission, on the basis of the impairment of the training signals received. In operation of the matrix division (MD) channel estimation in step 317 of FIG. 3, the base station transmits predetermined training symbols $X_K$, $X_{K+1}$, ... $X_{K+L}$, $X_{K+(L+1)}$, ... $X_{K+2L}$, known to the DSP at a times K, K+1, ... K+L, K+(L+1) ... K+2L, also known to the DSP, in the slot SL1. That is the DSP knows what $X_K$ is being sent. The transmission path impairs the symbols $X_K$, $X_{K+1}$, ... $X_{K+L}$, $X_{K+(L+1)}$, ... $X_{K+2L}$, and they are received as $Y_K$, $Y_{K+1}$, ... $Y_{K+L}$, $Y_{K+(L+1)}$, ... $Y_{K+2L}$. The DSP stores off-line transforms $Z_K$, $Z_{K+1}$, ... $Z_{K+L}$, $Z_{K+(L+1)}$, ... $Z_{K+2L}$ of the known $X_K$, $X_{K+1}$, ... $X_{K+L}$, $X_{K+(L+1)}$, ... $X_{K+2L}$ as reference values. According to an embodiment of the invention, these are stored in a read-only-memory (ROM) in the DSP. The DSP obtains a linear combination of $Y_K$, $Y_{K+1}$, ... $Y_{K+L}$ and $Z_K$, $Z_{K+1}$, ... $Z_{K+L}$, $Z_{K+(L+1)}$, ... $Z_{K+2L}$. The resulting output $C_0$, $C_1$, ... $C_L$, tells what the impairment is for each time K $C_0(K)$, $C_1(K)$, ... $C_L(K)$.

As shown in FIG. 5 the DSP includes a series of buffers $b_0$, $b_1$, ... $b_L$, $b_{L+1}$, ... $b_{2L}$, which contain the values $Z_K$, $Z_{K-1}$, ... $Z_{K-L}$, $Z_{K-(L+1)}$, ... $Z_{K-2L}$. In the DSP, at each counter position i (i=0, i=1, ... i=L) pointers r, r+1, ... r+L point to a block of the buffers $b_0$, $b_1$, ... $b_L$, $b_{L+1}$, ... $b_{2L}$. At counter position i=0, the pointers r, r+1, ... r+L point to the block of the buffers $b_0$, $b_1$, ... $b_L$ as shown in FIG. 5. At counter position i=1, i.e., at a second recursion, the pointers r, r+1, ... r+L point to the block of the buffers $b_1$, ... $b_L$, $b_{L+1}$. At counter position i=2, i.e., at a third recursion, the pointers r, r+1, ... r+L point to the block of the buffers $b_2$, ... $b_L$, ... $b_{L+2}$. This continues for each recursion until the counter reaches the position i=L. At counter position i=L, i.e., at the L−1 recursion, the pointers r, r+1, ... r+L point to the block of the buffers $b_L$, $b_{L+1}$, ... $b_{2L}$.

FIG. 4 illustrates an example of an application specific integrated circuit (ASIC). Here, a control CL1 performs the steps 301 to 314 and 330 to 340, a matrix division channel estimator MC1 performs the matrix division channel estimation of step 317, a least mean square estimator LM1 performs the least mean square estimation of step 320, and a maximum likelihood sequence estimator or decoder (MLSE) performs the maximum likelihood sequence estimation or decoding of step 324. The control CL1 includes the structure of FIG. 5

FIG. 6 illustrates the operation of FIGS. 4 and 5 and the MD channel estimation in step 317 of FIG. 3. In step 604 i=0 and the pointers r, r+1, . . . r+L point to the block of the buffers $b_0, b_1, \ldots b_L$ and hence to values $Z_K, Z_{K-1}, \ldots Z_{K-L}$, and enter the value $Z_K, Z_{K-1}, \ldots Z_{K-L}$ in registers $R_0, R_1, \ldots R_L$. In step 607, the registers $R_0, R_1, \ldots R_L$ respectively equal *r, *(r+1), . . . *(r+L). In step 610, this produces values $C_i = R_0 Y_K + R_1 Y_{K+1} + \ldots + R_L Y_{K+L}$. In step 614 the DSP increments the pointer r and the counter position i. In step 617, the DSP asks whether $i \leq L$. If yes, the DSP returns to step 607.

When i=1, the pointers r, r+1, . . . r+L then point to the block of the buffers $b_1, \ldots b_L, b_{L+1}$, and hence to values $Z_{K-1}, \ldots Z_{K-L}, Z_{K-(L-1)}$, and enter the value $Z_{K-1}, \ldots Z_{K-L}, Z_{K-(L-1)}$ in registers $R_0, R_1, \ldots R_L$. When i=2, the pointers r, r+1, . . . r+L then point to the block of the buffers $b_2, \ldots b_L, \ldots b_{L+2}$, and hence to values $Z_{K-}, \ldots Z_{K-L}, \ldots Z_{K-(L-2)}$, and enter the value $Z_{K-2}, \ldots Z_{K-L}, \ldots Z_{K-(L-2)}$ in registers $R_0, R_1, \ldots R_L$. When i=L, the pointers r, r+1, . . . r+L then point to the block of the buffers $b_L, \ldots b_{2L}$, and hence to values $Z_{K-L}, \ldots Z_{K-2L}$, and enter the value $Z_{K-2L}, \ldots Z_{K-2L}$ in registers $R_0, R_1, \ldots R_L$.

If the answer to the question in step 617, i.e. "is $i \leq L$?", is no, the sequence ends and the output is the accumulated values of step 610. This is the channel estimation $C_0, C_1, \ldots C_L$.

This channel estimation indicates what the impairment is for each time K $C_0(K), C_1(K), \ldots C_L(K)$. The channel decoder CD1 corrects for all or part of the impairment.

The phone CP1 also transmits data symbols and the same training symbols as the base station, back to the base station or to another base station. There the base station uses the structure and steps of FIGS. 1, and 3 to 6 to minimize the effects of impairment.

Maximum likelihood sequence estimation (MLSE) is described for example in articles H. Shiino, N. Yamaguchi, and Y. Shoji, "Performance of an adaptive maximum-likelihood receiver for fast fading multipath channel," in *Proc. 42nd IEEE Vehic. Technol. Conf.*, Denver, Colo., 1992, pp. 380–383. E. Dahlman, "New adaptive Viterbi detector for fast-fading mobile radio channels," *Electron, Lett.*, vol. 26, pp. 1572–1573, 1990. G. Larsson, B. Gudmundson, and K. Raith, "Receiver performance for the North American digital cellular system," in *Proc. 41st IEEE Vehic. Technol. Conf.*, St. Louis, Mo., 1991, pp. 1–6. A. Baier and G. Heinrich, "Performance of M-algorithm MLSE equalizer in frequency-selective fading mobile radio channels," in *Proc. IEEE ICC '89*, Boston, Mass., 1989, pp. 281–285. R. Mehlan and H. Meyr, "Soft output M-algorithm equalizer and trellis-coded modulation for mobile radio communication," *Proc. 42nd IEEE Vechic. Technol. Conf.*, in Denver, Colo. Forney, G. D. Jr (1972), "Maximum-likelihood sequence estimation of digital signaling in the presence of intersymbol interference," *IEEE Transaction of Information Theory*, Vol. IT-18, May, pp. 363–378.

According to one embodiment of the invention, the steps of FIGS. 3 and 6 are performed by a DSP chip. However, the steps may be performed by any processing arrangement. That is, the equalizer EQ1 may be constructed of processing arrangements other than a digital signal processor (DSP) chip.

The invention operates in an environment in which information is transmitted through the atmosphere to or from a moving station. The movement, and various interferences, such as mountains and trees, produce shifts within adjacent symbols and produce multipath fading within and among time slots.

The invention overcomes the effects of such fades and shifts. In the step 304 the equalizer EQ1 detects occurrences of fades per time slot. The training symbols sought in step 314 typically occur in each time slot of a frame. For example, there are training symbols in standard IS-54 for North American Digital Technology, Dual-Mode Mobile Station—Base Station Compatibility Standard. That is, in a transmission frame having N time slots, each time slot, contains one or more portions with training data. These training bits are periodically transmitted.

By using the combination of either one directional or bidirectional maximum likelihood sequence estimation and matrix division channel estimation, the invention permits high performance digital communication in hostile, fading and interference environments typical of mobile and cellular systems. It overcomes many of the difficulties encountered by prior equalizers. It also permits a reduction in the number of training symbols needed. The number needed may be as little as one third of those required for comparable performance. This results in special improvement in channels where few training symbols are available.

The invention effects estimation using the following equation, assuming that the channel does not change significantly in L+1 symbols:

$$\begin{pmatrix} y_k \\ y_{k-1} \\ \cdot \\ \cdot \\ \cdot \\ y_{k-L} \end{pmatrix} = \begin{pmatrix} x_k & x_{k-1} & \ldots & x_{k-L} \\ x_{k-1} & x_{k-2} & \ldots & x_{k-L-1} \\ \ldots & \ldots & \ldots & \ldots \\ x_{k-L} & x_{k-L-1} & \ldots & x_{k-2L} \end{pmatrix} \begin{pmatrix} C_0 \\ C_1 \\ \cdot \\ \cdot \\ \cdot \\ C_L \end{pmatrix} + \begin{pmatrix} n_k \\ n_{k-1} \\ \cdot \\ \cdot \\ \cdot \\ n_{k-L} \end{pmatrix}$$

where $Y_k$ etc. are the received training symbols, $x_k$ the transmitted training symbols, $c_i$ the channel distortions in the form of time-varying complex numbers, and $n_k$ the Gaussian noise.

The above equation may be written in the following matrix form:

$$\bar{y} = X\bar{x} + \bar{n}$$

When the matrix X is nonsingular, the channel may be estimated using the following matrix division approach:

$$\begin{pmatrix} C_0 \\ C_1 \\ \cdot \\ \cdot \\ C_L \end{pmatrix} \approx \begin{pmatrix} x_k & x_{k-1} & \ldots & x_{k-L} \\ x_{k-1} & x_{k-2} & \ldots & x_{k-L-1} \\ \ldots & \ldots & \ldots & \ldots \\ x_{k-L} & x_{k-L-1} & \ldots & x_{k-2L} \end{pmatrix}^{-1} \begin{pmatrix} y_k \\ y_{k-1} \\ \cdot \\ \cdot \\ y_{k-L} \end{pmatrix}$$

That is, $$\begin{pmatrix} C_0 \\ C_1 \\ \cdot \\ \cdot \\ C_L \end{pmatrix} \approx \begin{pmatrix} z_k & z_{k-1} & \ldots & z_{k-L} \\ z_{k-1} & z_{k-2} & \ldots & z_{k-L-1} \\ \ldots & \ldots & \ldots & \ldots \\ z_{k-L} & z_{k-L-1} & \ldots & z_{k-2L} \end{pmatrix} \begin{pmatrix} y_k \\ y_{k-1} \\ \cdot \\ \cdot \\ y_{k-L} \end{pmatrix}$$

where $$\begin{pmatrix} z_k & z_{k-1} & \cdots & z_{k-L} \\ z_{k-1} & z_{k-2} & \cdots & z_{k-L-1} \\ \cdots & \cdots & \cdots & \cdots \\ z_{k-L} & z_{k-L-1} & \cdots & z_{k-2L} \end{pmatrix} \approx$$

$$\begin{pmatrix} x_k & x_{k-1} & \cdots & x_{k-L} \\ x_{k-1} & x_{k-2} & \cdots & x_{k-L-1} \\ \cdots & \cdots & \cdots & \cdots \\ x_{k-L} & x_{k-L-1} & \cdots & x_{k-2L} \end{pmatrix}^{-1}$$

The matrix division is then a matrix division of the received training symbols by the known training symbols to obtain a channel estimation. Ultimately it is the product of stored transforms $Z_k$ etc. of the known transmitted training symbols.

The transceiver TR1 and modulator MD1 form a transceiver section. The converter CV1, speaker SP1 and microphone MC1 form an output section. Each slot in FIG. 1A may have more than one training sequence. For example before and after the data sequence. The training sequence may occur between data sequences.

According to another embodiment of the invention, the equalizer EQ1 includes means for recursive least square channel estimation in the absence of training symbols.

The phone CP1 is a mobile station in a cellular telephone system. Thus the mobile station and the base station are each data-transmitting and data-receiving stations in cellular system.

Further known subject matter on which this application is based appears in Liu, Y. (1993) "Quickest Detection of a Change in a Random Sequence with Application to Adaptive Identification of Fading Channels", PhD thesis, Department of Electrical Engineering, Queen's University, Kingston, Ontario, Canada.

According to one embodiment of the invention, the maximum likelihood sequence estimating arrangement is one directional. According to another embodiment, the maximum likelihood sequence estimating arrangement is bidirectional.

According to yet another embodiment of the invention, the equalizer includes a buffer for storing received symbols and produces forward and reverse time processing to a symbol $N_m$ near the mid point of the time slot.

While embodiments of the invention have been described in detail, it will be recognized by those skilled in the art that the invention may be embodied otherwise without departing from its spirit and scope.

What is claimed is:

1. A cellular transmitting and receiving station for communicating with another station that transmits a plurality of training symbols, comprising:
    a transceiver section;
    an impairment-equalizing signal processor coupled to said transceiver section and having a memory containing stored training symbols corresponding to the training symbols transmitted by the other station;
    said signal processor including an impairment-sensing matrix division channel estimating arrangement responsive to said stored training symbols and to received training symbols performing channel estimation, and an impairment-effect-minimizing maximum likelihood sequence estimating arrangement.

2. A station as in claim 1, wherein said matrix division channel estimating arrangement includes means for storing transforms of the training symbols and for producing a linear combination of received training symbols and the stored transforms.

3. A station as in claim 1, wherein said maximum likelihood sequence estimating arrangement is one directional.

4. A station as in claim 1, wherein said maximum likelihood sequence estimating arrangement is bidirectional.

5. A station as in claim 2, wherein said impairment-sensing matrix division channel estimating arrangement and said impairment-effect-minimizing maximum likelihood sequence estimating arrangement form an equalizer including means for performing maximum division equalization and maximum likelihood sequence equalization for each of $N_s$ symbols in a time slot, and wherein communication is performed in frames each having N time slots.

6. A station as in claim 2, wherein said matrix division channel estimation is in the form of the estimator $$\begin{pmatrix} c_0 \\ c_1 \\ \cdot \\ \cdot \\ \cdot \\ c_L \end{pmatrix} \approx \begin{pmatrix} x_k & x_{k-1} & \cdots & x_{k-L} \\ x_{k-1} & x_{k-2} & \cdots & x_{k-L-1} \\ \cdots & \cdots & \cdots & \cdots \\ x_{k-L} & x_{k-L-1} & \cdots & x_{k-2L} \end{pmatrix}^{-1} \begin{pmatrix} y_k \\ y_{k-1} \\ \cdot \\ \cdot \\ \cdot \\ y_{k-L} \end{pmatrix}$$

7. A station as in claim 6, wherein said equalizer includes means for least mean square estimation in the absence of received training symbols.

8. A station as in claim 6, wherein said equalizer includes means for recursive least square channel estimation in the absence of training symbols.

9. A station as in claim 5, wherein said equalizer includes a buffer for storing received symbols and produces forward and reverse time processing to a symbol $N_m$ near the mid point of the time slot.

10. A station as in claim 1, wherein said impairment-effect-minimizing arrangement is a maximum likelihood sequence estimator in an application specific integrated circuit (ASIC).

11. A station as in claim 1, wherein said impairment-effect-minimizing arrangement is a maximum likelihood sequence estimating detector application specific integrated circuit (ASIC).

12. A method of wireless digital communication subject to impairment during propagation, comprising:
    storing representations of the training symbols;
    receiving and transmitting radio frequency digital signals arranged in frames having a plurality of time slots and a plurality of training symbols and data signals in each time slot;
    processing said signals with equalization by matrix division channel estimation on the basis of correlating received training symbols with stored training symbols to obtain a channel estimation and maximum likelihood sequence estimation for each time slot, so as to minimize the effects of impairment on transmitted symbols.

13. A method as in claim 12, wherein said matrix division channel estimation includes storing transforms of the training symbols and producing a linear combination of received training symbols and the stored transforms.

14. A method as in claim 12, wherein said maximum likelihood sequence estimation is one directional.

15. A method as in claim 12, wherein said maximum likelihood sequence estimation is bidirectional.

16. A method as in claim 13 wherein said processing step includes performing matrix division equalization and maximum likelihood sequence equalization for each of $N_s$ symbols in a time slot, and wherein communication is performed in frames each having N time slots.

17. A method as in claim 12, wherein said maximum likelihood sequence estimation is one directional.

18. A method as in claim 13, wherein said matrix division estimation is a matrix division channel estimator $$\begin{pmatrix} c_0 \\ c_1 \\ . \\ . \\ . \\ c_L \end{pmatrix} \approx \begin{pmatrix} x_k & x_{k-1} & \ldots & x_{k-L} \\ x_{k-1} & x_{k-2} & \ldots & x_{k-L-1} \\ \ldots & \ldots & \ldots & \ldots \\ x_{k-L} & x_{k-L-1} & \ldots & x_{k-2L} \end{pmatrix}^{-1} \begin{pmatrix} y_k \\ y_{k-1} \\ . \\ . \\ . \\ y_{k-L} \end{pmatrix}$$

19. A method as in claim 17, wherein said processing step includes least mean square estimation in the absence of training symbols.

20. A method as in claim 17, wherein said processing step includes recursive least square channel estimation in the absence of training symbols.

21. A method as in claim 15, wherein said processing step includes storing received symbols in a buffer and producing forward and reverse time processing to a symbol $N_m$ near the mid point of the time slot.

22. A method as in claim 21, wherein said processing step includes performing maximum division estimation and maximum likelihood sequence estimation for each of $N_s$ symbols in a time slot, and wherein communication is performed in frames each having N time slots.

* * * * *